US007173274B2

(12) United States Patent
Chu et al.

(10) Patent No.: US 7,173,274 B2
(45) Date of Patent: *Feb. 6, 2007

(54) INCORPORATION OF CARBON IN SILICON/SILICON GERMANIUM EPITAXIAL LAYER TO ENHANCE YIELD FOR SI-GE BIPOLAR TECHNOLOGY

(75) Inventors: Jack Oon Chu, Manhasset Hills, NY (US); Douglas Duane Coolbaugh, Essex Junction, VT (US); James Stuart Dunn, Jericho, VT (US); David R. Greenberg, White Plains, NY (US); David L. Harame, Essex Junction, VT (US); Basanth Jagannathan, Stormville, NY (US); Robb Allen Johnson, South Burlington, VT (US); Louis D. Lanzerotti, Burlington, VT (US); Kathryn Turner Schonenberg, New Fairfield, CT (US); Ryan Wayne Wuthrich, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/953,378

(22) Filed: Sep. 29, 2004

(65) Prior Publication Data

US 2005/0054171 A1 Mar. 10, 2005

Related U.S. Application Data

(60) Continuation of application No. 10/122,857, filed on Apr. 15, 2002, now Pat. No. 6,815,802, which is a division of application No. 09/774,126, filed on Jan. 30, 2001, now Pat. No. 6,426,265.

(51) Int. Cl.
*H01L 29/06* (2006.01)
*H01L 31/072* (2006.01)
*H01L 31/109* (2006.01)
*H01L 31/0328* (2006.01)
*H01L 31/0339* (2006.01)

(52) U.S. Cl. .......................... 257/19; 257/47; 257/557; 257/558; 257/565; 257/588; 257/590; 257/591; 257/592; 257/593

(58) Field of Classification Search ................. 257/19, 257/47, 557–558, 565, 588, 590–593
See application file for complete search history.

(56) References Cited

U.S. PATENT DOCUMENTS 4,885,614 A * 12/1989 Furukawa et al. ............ 257/76

(Continued)

FOREIGN PATENT DOCUMENTS

EP 938140 A2 * 8/1999

(Continued)

*Primary Examiner*—Ida M. Soward
(74) *Attorney, Agent, or Firm*—Scully, Scott, Murphy & Presser, P.C.; William D. Sabo, Esq.

(57) ABSTRACT

A SiGe bipolar transistor containing substantially no dislocation defects present between the emitter and collector region and a method of forming the same are provided. The SiGe bipolar transistor includes a collector region of a first conductivity type; a SiGe base region formed on a portion of said collector region; and an emitter region of said first conductivity type formed over a portion of said base region, wherein said collector region and said base region include carbon continuously therein. The SiGe base region is further doped with boron.

10 Claims, 13 Drawing Sheets

U.S. PATENT DOCUMENTS

| | | | |
|---|---|---|---|
| 5,093,704 A | 3/1992 | Saito et al. | 257/63 |
| 5,140,400 A | 8/1992 | Morishita | 257/197 |
| 5,159,424 A | 10/1992 | Morishita | 257/197 |
| 5,241,214 A | 8/1993 | Herbots et al. | 257/649 |
| 5,272,096 A | 12/1993 | de Fresart et al. | 438/312 |
| 5,320,972 A | 6/1994 | Wylie | 438/366 |
| 5,321,302 A | 6/1994 | Shimawaki | 257/592 |
| 5,323,031 A * | 6/1994 | Shoji et al. | 257/198 |
| 5,422,502 A * | 6/1995 | Kovacic | 257/197 |
| 5,426,316 A * | 6/1995 | Mohammad | 257/197 |
| 5,441,901 A | 8/1995 | Candelaria | 438/317 |
| 5,481,124 A | 1/1996 | Kozuka et al. | 257/185 |
| 5,495,115 A | 2/1996 | Kudo et al. | 257/190 |
| 5,496,746 A | 3/1996 | Matthews | 438/350 |
| 5,506,427 A | 4/1996 | Imai | 257/197 |
| 5,514,885 A * | 5/1996 | Myrick | 257/216 |
| 5,557,121 A * | 9/1996 | Kozuka et al. | 257/292 |
| 5,656,514 A | 8/1997 | Ahlgren et al. | 438/320 |
| 5,668,022 A * | 9/1997 | Cho et al. | 438/320 |
| 5,677,201 A * | 10/1997 | Kozuka et al. | 438/59 |
| 5,691,546 A | 11/1997 | Morishita | 257/19 |
| 5,734,193 A | 3/1998 | Bayraktaroglu et al. | 257/579 |
| 5,818,100 A | 10/1998 | Grider et al. | 257/616 |
| 5,846,867 A | 12/1998 | Gomi et al. | 438/318 |
| 5,963,817 A | 10/1999 | Chu et al. | 438/410 |
| 6,087,683 A | 7/2000 | King et al. | 257/183 |
| 6,154,475 A * | 11/2000 | Soref et al. | 372/45.011 |
| 6,258,685 B1 | 7/2001 | Fujita et al. | 438/312 |
| 6,316,795 B1 | 11/2001 | Croke, III | 257/197 |
| 6,333,235 B1 | 12/2001 | Lee et al. | 438/309 |
| 6,396,107 B1 * | 5/2002 | Brennan et al. | 257/362 |
| 6,417,058 B1 * | 7/2002 | Richardson et al. | 438/312 |
| 6,429,085 B1 * | 8/2002 | Pinter | 438/320 |
| 6,461,925 B1 * | 10/2002 | John et al. | 438/309 |
| 6,492,711 B1 * | 12/2002 | Takagi et al. | 257/593 |
| 6,509,242 B2 * | 1/2003 | Frei et al. | 438/312 |
| 6,534,371 B2 | 3/2003 | Coolbaugh et al. | 438/312 |
| 6,597,016 B1 * | 7/2003 | Yuki et al. | 257/77 |
| 6,740,560 B1 * | 5/2004 | Heinemann et al. | 438/309 |
| 6,800,881 B2 * | 10/2004 | Lippert et al. | 257/198 |
| 6,815,802 B2 * | 11/2004 | Chu et al. | 257/592 |
| 6,893,933 B2 * | 5/2005 | Ahn et al. | 438/343 |
| 6,894,366 B2 * | 5/2005 | Howard et al. | 257/565 |
| 2002/0093031 A1 | 7/2002 | Frei et al. | 257/200 |
| 2002/0096693 A1 * | 7/2002 | Coolbaugh et al. | 257/197 |
| 2002/0096742 A1 * | 7/2002 | Voldman | 257/565 |
| 2003/0071277 A1 | 4/2003 | Lippert et al. | 257/197 |

FOREIGN PATENT DOCUMENTS

JP         200077425 A   *   3/2000

* cited by examiner

INCORPORATION OF CARBON IN SILICON/SILICON GERMANIUM EPITAXIAL LAYER TO ENHANCE YIELD FOR SI-GE BIPOLAR TECHNOLOGY

RELATED APPLICATIONS

This application is a continuation of U.S. application Ser. No. 10/122,857, filed Apr. 15, 2002, now U.S. Pat. No. 6,815,802 which application is a divisional of U.S. application Ser. No. 09/774,126, filed Jan. 30, 2001, now U.S. Pat. No. 6,426,265.

FIELD OF THE INVENTION

The present invention relates to bipolar transistors, and more particularly to a silicon germanium (SiGe) bipolar transistor which includes a lightly doped Si collector region and a SiGe base region that include carbon, C, continuously incorporated throughout the collector and SiGe base regions. A method of continuously incorporating C into the lightly doped Si collector region and SiGe base region of a SiGe bipolar transistor is also disclosed herein. The term SiGe is used herein to denote silicon-germanium alloys, i.e., $Si_{1-x}Ge_x$.

BACKGROUND OF THE INVENTION

Significant growth in both high-frequency wired and wireless markets has introduced new opportunities where compound semiconductors such as SiGe have unique advantages over bulk complementary metal oxide semiconductor (CMOS) technology. With the rapid advancement of epitaxial-layer pseudomorphic SiGe deposition processes, epitaxial-base SiGe heterojunction bipolar transistors have been integrated with mainstream advanced CMOS development for wide market acceptance, providing the advantages of SiGe technology for analog and RF circuitry while maintaining the full utilization of the advanced CMOS technology base for digital logic circuitry.

SiGe heterojunction bipolar transistor devices are replacing silicon bipolar junction devices as the primary element in all analog applications. A typical prior art SiGe heterojunction bipolar transistor is shown in FIG. 1. Specifically, the prior art heterojunction bipolar transistor includes an n+ subcollector layer 10 having a layer of n− Si collector (i.e., lightly doped) region 12 formed thereon. The transistor further includes p+ SiGe base region 14 formed on the lightly doped Si collector region. One portion of base region 14 includes n+ Si emitter region 16 and other portions include base electrodes 18 which are separated from the emitter region by spaces 20. On top of emitter region 16 is an emitter electrode 22.

A major problem with bipolar SiGe transistors of the type illustrated in FIG. 1 is the presence of dislocations between the collector and emitter regions. When these dislocations extend between the collector region and the emitter region, bipolar pipe, e.g., CE, shorts occur; Pipe shorts are a major yield detractor in SiGe bipolar technology.

In the prior art, it is known to incorporate carbon into a bipolar structure so as to form a carbon layer over the base in the SiGe region only. Such a structure is shown in FIG. 2 wherein reference numeral 24 denotes the grown carbon layer. This prior art technique which forms a C layer over the base in the SiGe region results in a narrow base width by hindering diffusion of the intrinsic base region. This result is shown, for example, in FIG. 3.

Carbon incorporation is typically employed in the prior art to prevent the out-diffusion of boron into the base region. For example, it is known that the transient enhanced diffusion of boron is strongly suppressed in a carbon-rich silicon layer, See H. J. Osten, et al., "Carbon Doped SiGe Heterjunction Bipolar Transistors for High Frequency Applications", IEEEBTCM 7.1, 109. Boron diffusion in silicon occurs via an interstitial mechanism and is proportional to the concentration of silicon self-interstitials. Diffusion of carbon out of the carbon-rich regions causes an undersaturation of silicon self-interstitials. As a result, the diffusion of boron in these regions is suppressed. Despite being able to suppress the diffusion of boron, this prior art method which forms C over the base in the SiGe region only is not effective in reducing pipe shorts.

In view of the bipolar pipe shorts problem mentioned above, there is a continued need for the development of a new and improved method for fabricating SiGe bipolar transistors in which dislocations between the emitter and collector regions are substantially eliminated, without narrowing the base width as is the case with prior art methods.

SUMMARY OF THE INVENTION

One object of the present invention is to provide a method of fabricating a SiGe bipolar transistor in which the formation of dislocations between the emitter and collector regions have been substantially suppressed therefore avoiding the problem of bipolar pipe, e.g., CE, shorts.

Another object of the present invention is to provide a method of fabricating a SiGe bipolar structure in which the transistor yield of epitaxially grown silicon/SiGe region is enhanced.

A further object of the present invention is to provide a method of fabricating a bipolar SiGe transistor in which carbon can be incorporated into the structure without narrowing the base width.

A yet further object of the present invention is to provide a method of fabricating a bipolar SiGe transistor which is cost effective and that can be easily implemented with existing SiGe bipolar technology.

These and other objects and advantages are achieved in the present invention by incorporating carbon into the lightly doped Si layer as well as the SiGe base region. In accordance with the present invention, the C incorporation occurs during the epitaxial growth of the SiGe layer by using a deposition process such as ultra-high vacuum chemical vapor deposition (UHVCVD), rapid thermal chemical vapor deposition (RTCVD), molecular beam epitaxy (MBE), or plasma-enhanced chemical vapor deposition (PECVD), wherein a carbon source gas is employed. By employing the inventive method, carbon is continuously formed throughout the Si collector region and the SiGe base region. Moreover, applicants have found that the inventive method provides enhanced yield of SiGe as well as suppressing dislocations which cause bipolar pipe shorts.

In one aspect of the present invention, a method of fabricating a SiGe bipolar transistor which exhibits essentially no pipe shorts is provided. Specifically, the inventive method of fabricating the SiGe bipolar transistor includes the steps of:

(a) providing a structure which includes at least a bipolar device region, said bipolar device region including at least a collector region of a first conductivity type formed in a semiconductor substrate;

(b) depositing a SiGe base region on said collector region, wherein during said depositing carbon is continuously grown through the collector region and the SiGe base region; and (c) forming a patterned emitter region over said SiGe base region.

In accordance with the above described method, depositing step (b) may include UHVCVD, MBE, RTCVD, PECVD or another like deposition process which is capable of forming a SiGe base region. Of these deposition processes, it is preferred to use a UHVCVD process.

Another aspect of the present invention relates to a method of incorporating C into the collector region and the SiGe base region of a bipolar transistor. In accordance with this aspect of the present invention, the method includes a step of depositing a SiGe base region on a lightly doped Si collector region, wherein during said depositing carbon is continuously grown through the collector region and the SiGe base region.

In accordance with the this aspect of the present invention, the SiGe base region may be formed by UHVCVD, MBE, RTCVD, PECVD or another like deposition process which is capable of forming such a region. Of these deposition processes, it is preferred to use a UHVCVD process.

A further aspect of the present invention relates to a SiGe bipolar transistor which includes substantially no dislocation defects present between the emitter and collector region, said structure comprising:

a collector region of a first conductivity type;

a SiGe base region; and an emitter region of said first conductivity type formed over a portion of said base region, wherein said collector region and said base region include carbon continuously present in said collector and SiGe base regions and said SiGe base is further doped with B.

DETAILED DESCRIPTION OF THE INVENTION

Figure 1:
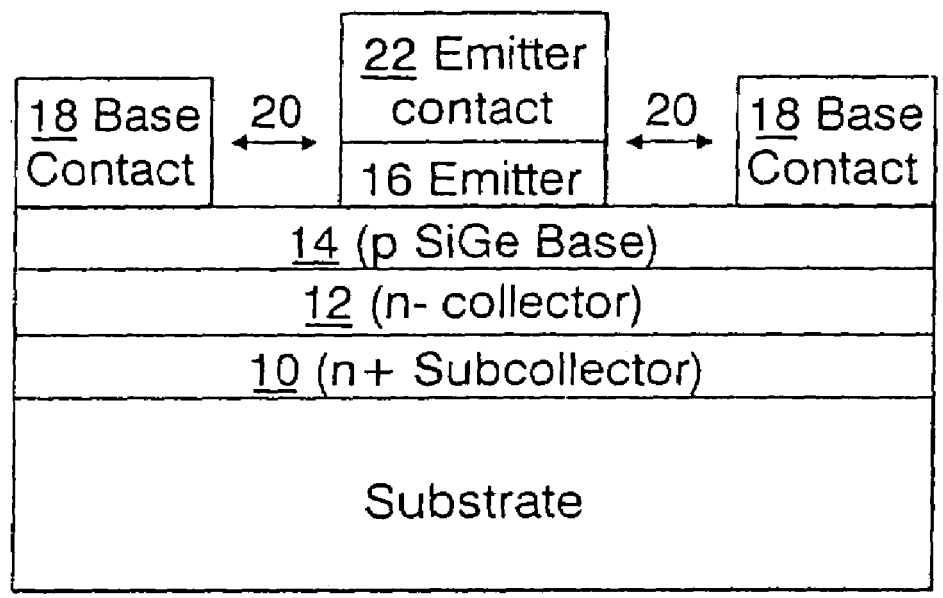
FIG. 1 is pictorial representation of a fragment of a prior art SiGe bipolar transistor.

The present invention which is directed to a method of continuously incorporating C into the lightly doped Si collector region as well as the SiGe base layer and a SiGe bipolar structure produced therefrom will now be described in more detail by referring to the drawings that accompany the present invention.

Figure 4:
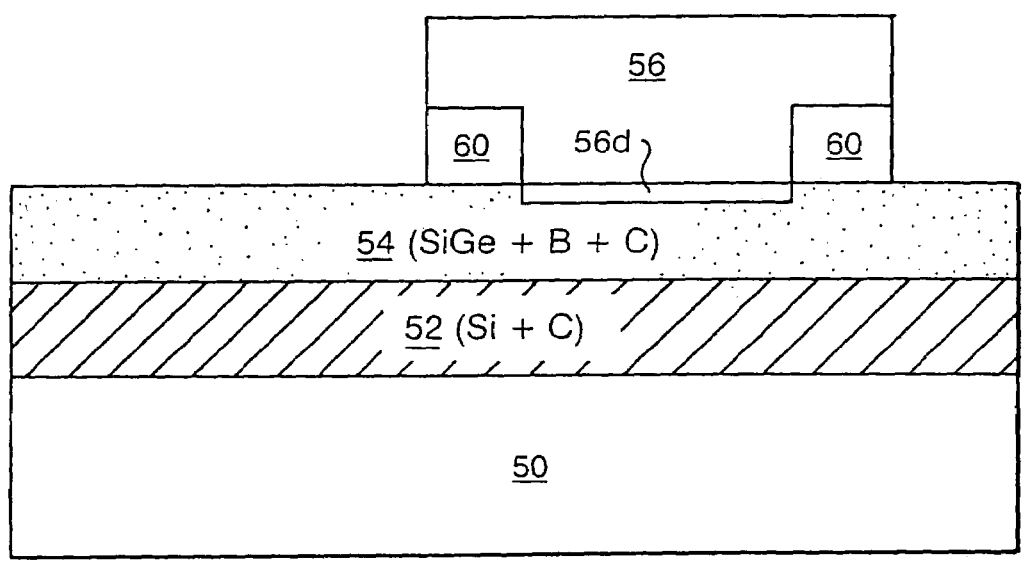
FIG. 4 is a pictorial representation of a fragment of the inventive SiGe bipolar transistor including a C layer continuously grown in the collector and SiGe base regions.

Reference is first made to FIG. 4 which is a cross-sectional illustration of a fragment of the inventive SiGe bipolar transistor. Specifically, the SiGe bipolar transistor shown in FIG. 4 comprises a collector region 52 of a first conductivity type (n or p-type doped) which is formed on substrate 50. On top of a portion of collector region 52 is SiGe base region 54 which includes emitter region 56 and emitter diffusion 56d. Region 60 denote an insulator. The SiGe base region is characterized as being doped with B. It should be noted that the bipolar transistor shown in FIG. 4 represents only a fragment of the bipolar transistor. For simplicity, the drawings have omitted other regions which are typically formed in a bipolar transistor structure.

Figure 2:
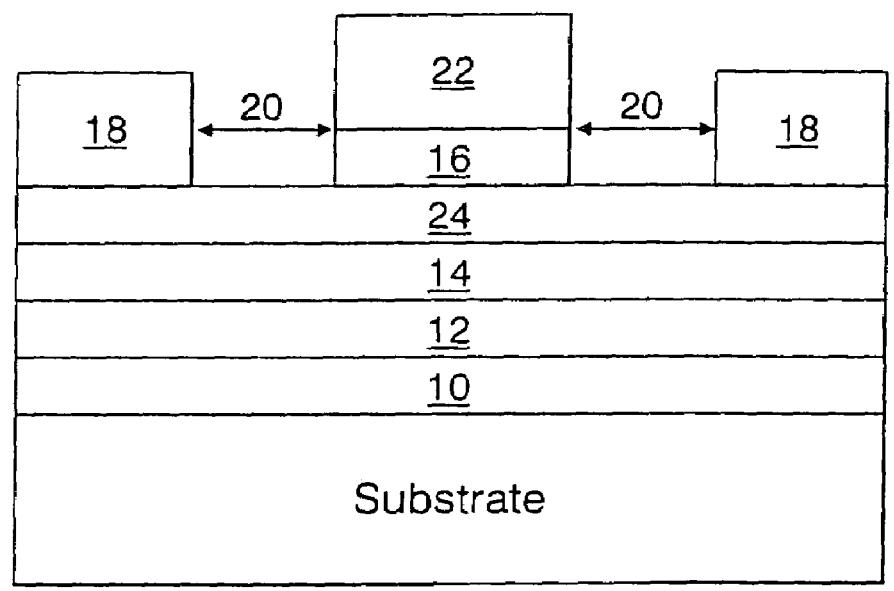
FIG. 2 is a pictorial representation of a fragment of a prior art SiGe bipolar transistor including a C layer grown over the base in only the SiGe region.
Figure 3:
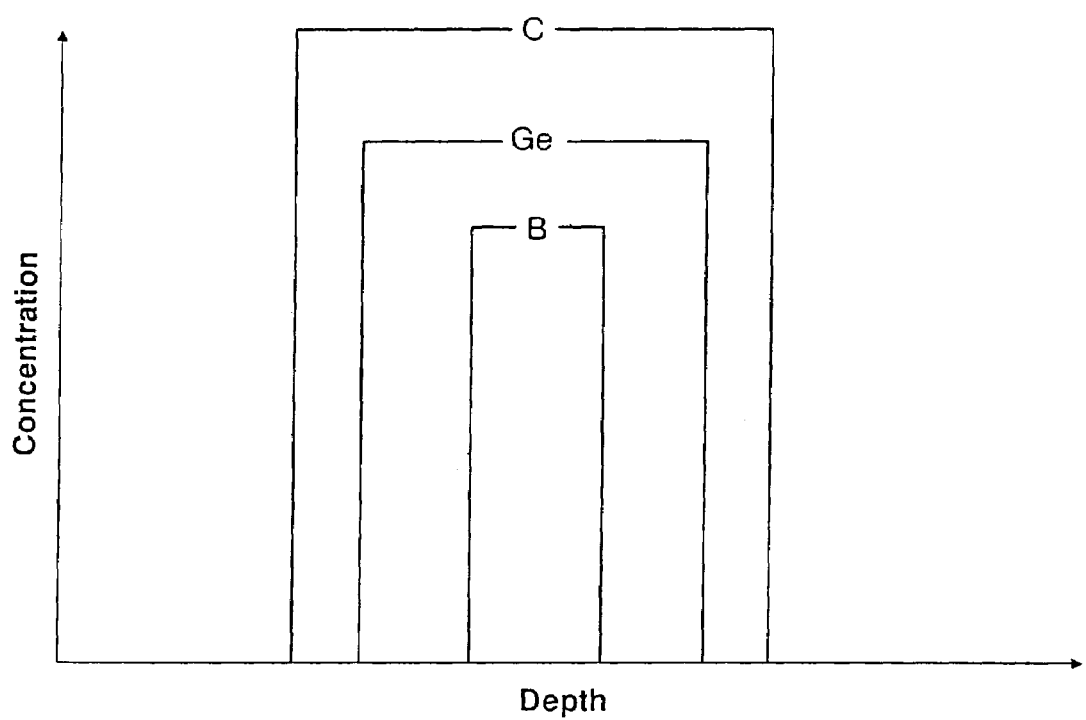
FIG. 3 is a plot of boron (B), germanium (Ge) and carbon (C) concentration versus depth (Å) for prior-art methods wherein C is incorporated over the SiGe base region.

In accordance with the present invention, the SiGe base region and the collector region, i.e., lightly doped Si, include C continuously distributed, i.e., grown, throughout these layers of the bipolar transistor. It is emphasized that the structure depicted in FIG. 4 is unlike prior art SiGe bipolar transistors in which C is grown only above the SiGe base region, See FIG. 2.

In accordance with the present invention, the concentration of C present within the SiGe base region and the collector region is from about 5E17 to about 1E21 atoms cm$^{-3}$, with a range of C concentration of from about 1E19 to about 1E20 atoms cm$^{-3}$ being more highly preferred.

Figure 5:
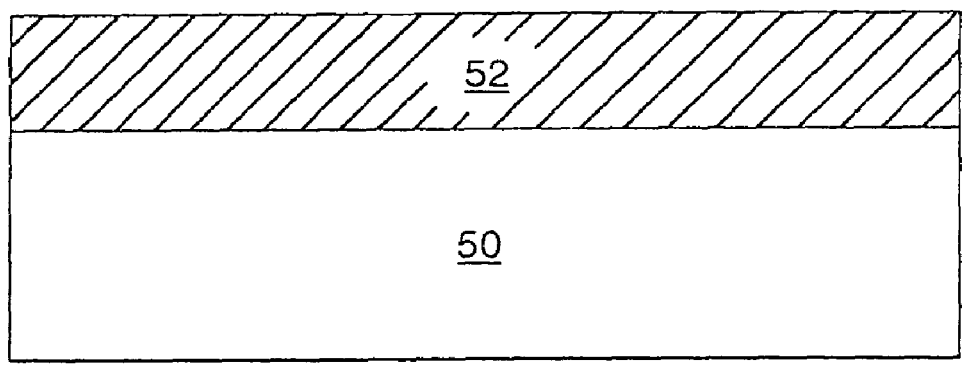
FIGS. 5–10 show the inventive SiGe bipolar transistor through the basic processing steps of the present invention.

The method used in forming the inventive structure shown in FIG. 4 will now be described in more detail by referring to FIGS. 5–10 and the discussion that appears hereinbelow. Specifically, FIG. 5 shows an initial structure that is employed in the present invention in forming the SiGe bipolar transistor. The structure of FIG. 5 includes Si substrate 50 which includes collector region 52 of a first conductivity type formed on a surface of substrate 50. The structure shown in FIG. 5 is formed utilizing conventional processes that are well known to those skilled in the art. For example, the collector region is formed on the surface of substrate 10 by epitaxially growing a Si layer (not shown) on the substrate. An oxide layer, not shown in the drawings, is then formed on the surface of the epi-Si layer and thereafter an n- or p-type dopant is implanted into the epi-Si layer and the region is activated using a conventional activating annealing process. Following ion implantation and annealing, the oxide layer is removed from the surface of the structure prior to forming the SiGe layer thereon. The above processes result in the formation of the collector region in the substrate. A preferred means for removing the oxide layer is by employing a HF etching process. Another method which can be employed in the present invention in forming the subcollector region is by utilizing a conventional high-energy P-implant process.

Figure 6:
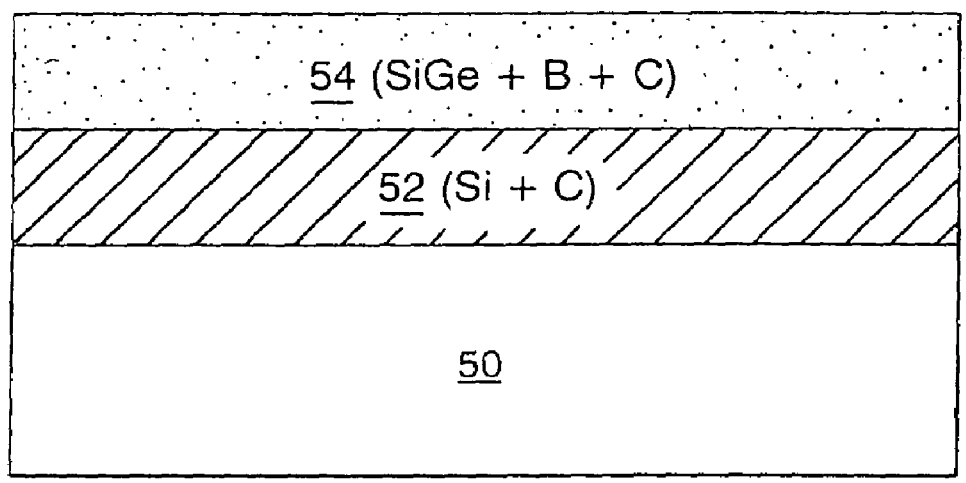

Next, and as shown in FIG. 6, SiGe layer 54 is formed on the collector region utilizing a suitable deposition process which is capable of epitaxially growing a SiGe base region while continuously growing C into the base and collector regions. The SiGe base region that is formed in the present invention typically has a thickness of from about 10 to about 200 nm. More preferably, the SiGe base region has a thickness of from about 50 to about 70 nm. It should be noted that in the present invention the SiGe base region includes C and B in the crystal lattice. That is, the SiGe base region is an alloyed SiGe region which includes SiGe, B and C therein.

In accordance with the present invention, the SiGe base layer may be formed by utilizing UHVCVD, MBE, RTCVD, PECVD or another like deposition process which is capable of epitaxially forming such a SiGe layer. Of these deposition processes, it is preferred to use a UHVCVD process.

The UHCVD process used in the present invention in forming the SiGe base region is carried out in a low temperature epi (LTE) reactor which operates at temperatures of about 650° C. or less and at operating pressures of about 250 milliTorr or less. More preferably, the UHVCVD process is carried out in an epi reactor that operates at a temperature of from about 500° to about 650° C. and at an operating pressure of from about 0.1 to about 20 milliTorr. In the present invention, the UHVCVD process is carried out using a gas mixture which includes a Si source, a Ge source, a B source and a C source: Although a variety of Si, Ge, B and C sources can be employed in the present invention, it is preferred to utilize a gas mixture which includes a silane or other like Si-containing source gas as the Si source, germane, $GeH_4$, as the Ge source, diborane, $B_2H_6$, as the B source and ethylene, methylsilane or methane as the C source. Of the aforementioned C sources, it most preferred to employ ethylene as the C source gas.

The source gases may be used undiluted or the source gases may be used in conjunction with an inert gas such as helium, nitrogen, argon or hydrogen. For example, the Ge source gas may include germane in 5% inert gas and the C source gas may include one of the above mentioned C source gases (about 0.5 to about 2%) in an inert gas. Moreover, the source gases may be premixed prior to introduction into the epi reactor or the source gases may be introduced as separate streams.

The concentrations of Si and Ge employed in the present invention is not critical to the present invention as long as the Si and Ge concentrations are sufficient to form a SiGe base layer.

It is noted that the above-mentioned UHVCVD process (or related deposition processes) is capable of continuously growing C throughout the base region as well as the SiGe base region of the bipolar structure. Moreover, applicants have found that the above-mentioned UHVCVD process improves the yield of the SiGe base as well as suppressing the dislocations that cause bipolar pipe shorts. These findings are not reported in prior art processes wherein C is grown over the SiGe base region only. The present process thus represents an improved means of forming a SiGe bipolar transistor, wherein C essentially forms an intrinsic sink.

Figure 11:
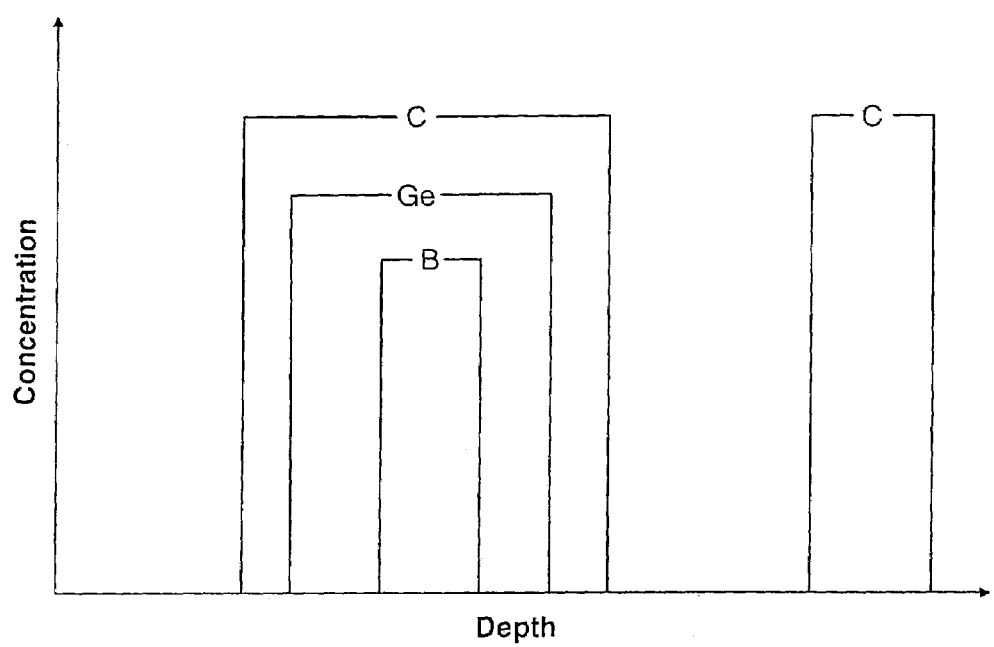
FIGS 11–13 are plots of boron (B), germanium (Ge) and carbon (C) concentration versus depth (Å) for the inventive method wherein C is continuously incorporated into the collector region and the SiGe base region.
Figure 12:
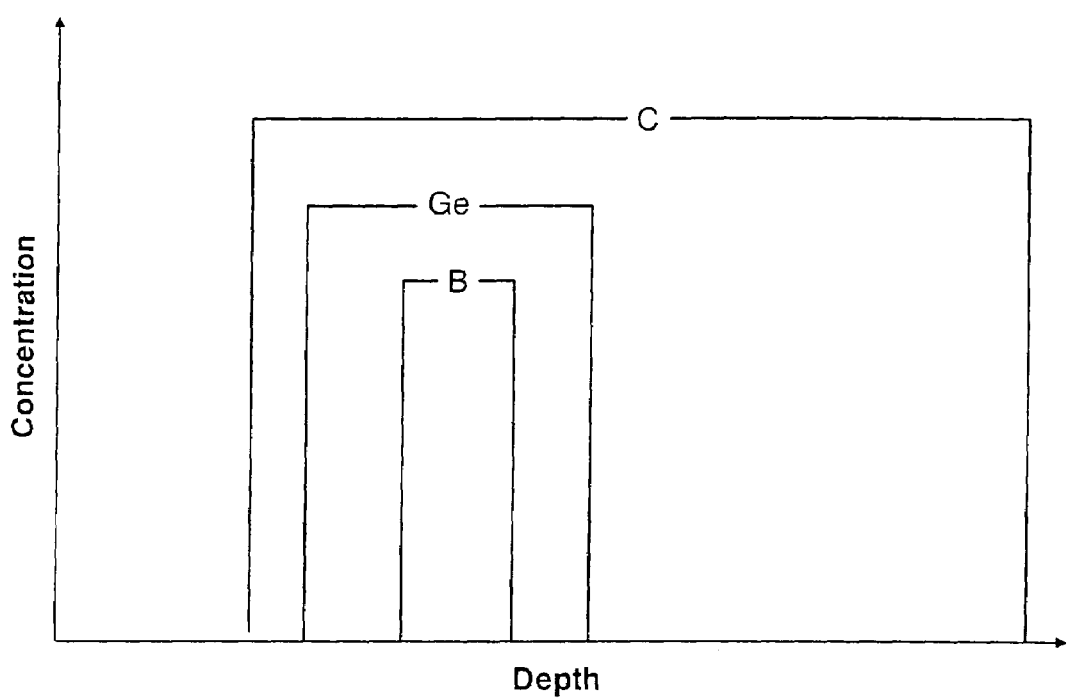
Figure 13:
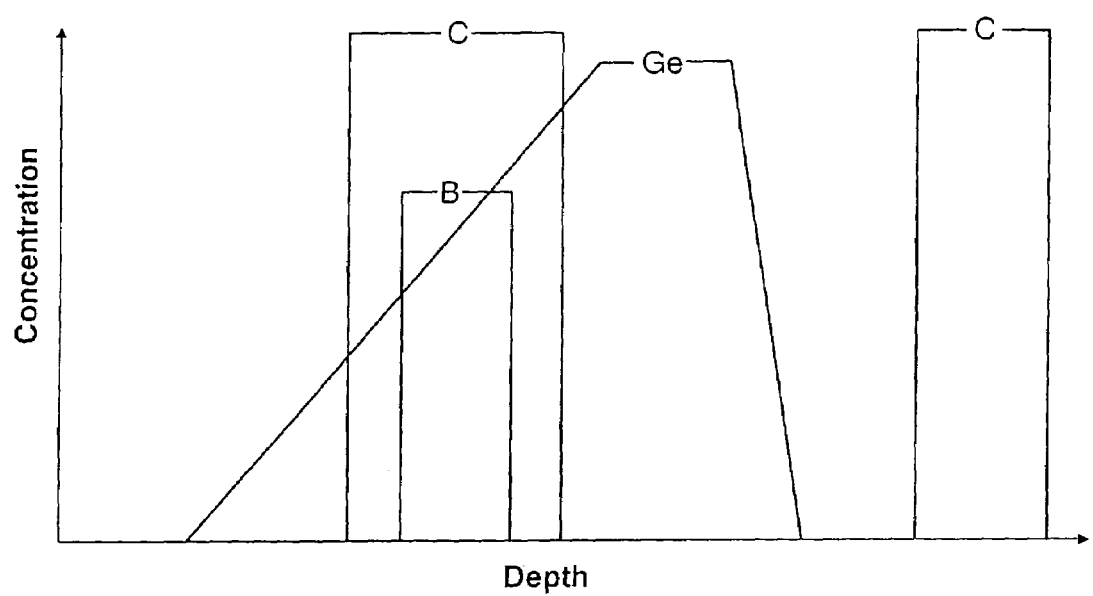

FIGS. 11–13 illustrate the SiGe profile for the process in which C is incorporated in the UHVCVD deposited epitaxial grown SiGe base and in the Si collector region. The carbon is grown in discrete intervals separating the SiGe base region and the lightly doped Si layer (i.e., collector) in FIG. 11 and is continuously formed throughout these regions in FIG. 12. The low concentration of C in the lightly doped Si acts as an intrinsic sink reducing dislocation formation. Incorporation of C does restrict the Ge profile; therefore, as shown in FIGS. 12–13, the Ge profile can be graded and is not fixed.

Figure 7:
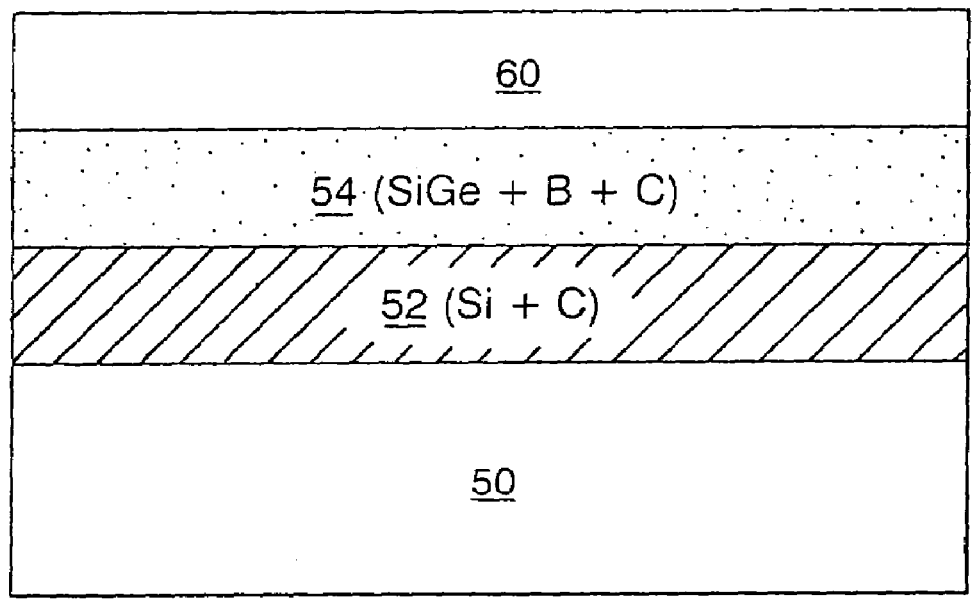

Referring back to the inventive process, insulator 60 is then formed of the surface of the SiGe film utilizing a conventional deposition process well known in the art, See FIG. 7. Suitable deposition processes include, but are not limited to: CVD, plasma-enhanced CVD, sputtering, chemical solution deposition and other like deposition processes. Insulator 60 may comprise a single insulator material or it may include combinations of more than one insulator material, i.e., a dielectric stack. The insulator used in this step of the present invention may comprise an oxide, a nitride or a combination thereof.

Figure 8:
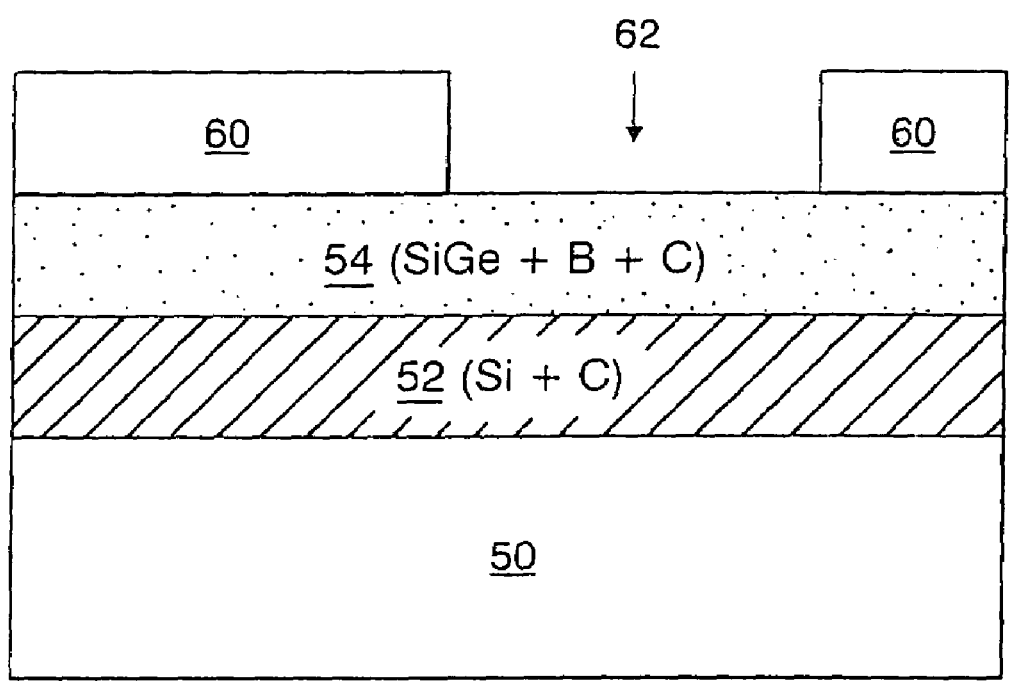

FIG. 8 shows the structure after emitter window opening 62 has been formed through insulator 60 exposing a surface of SiGe film. The emitter window opening is formed utilizing conventional lithography and etching such as reactive-ion etching (RIE).

Figure 9:
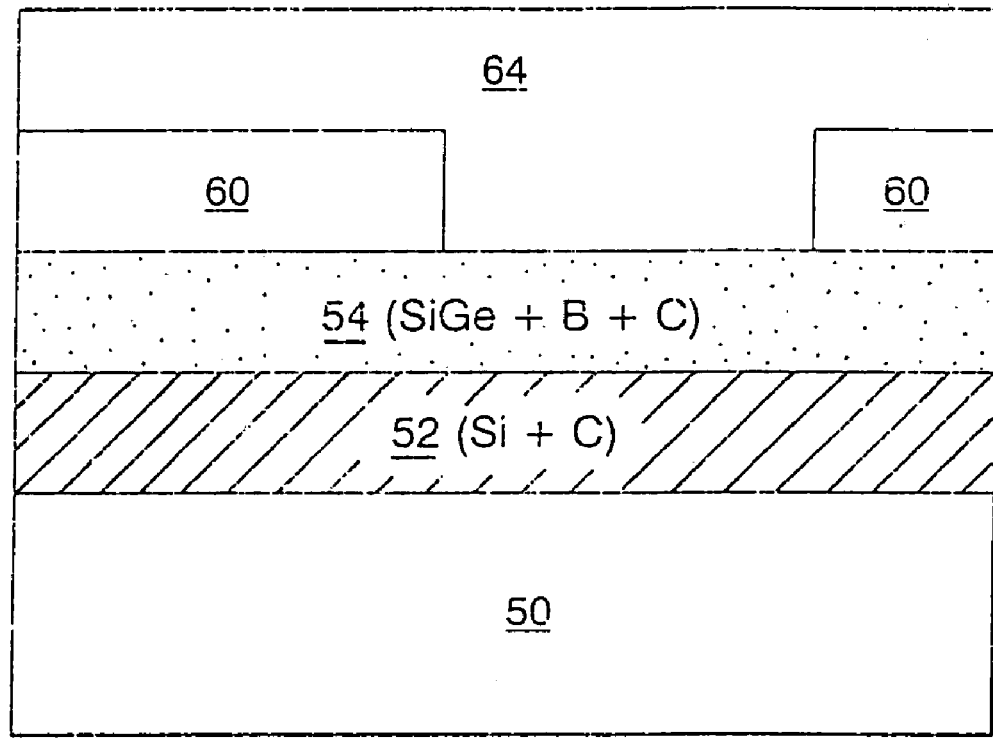

FIG. 9 shows the structure after a layer of intrinsic polysilicon 64 is formed in the emitter window opening as well as over the insulator layer. The intrinsic polysilicon which forms the emitter region of the bipolar SiGe transistor is formed by any conventional in-situ doping deposition process that is well known to those skilled in the art.

Figure 10:
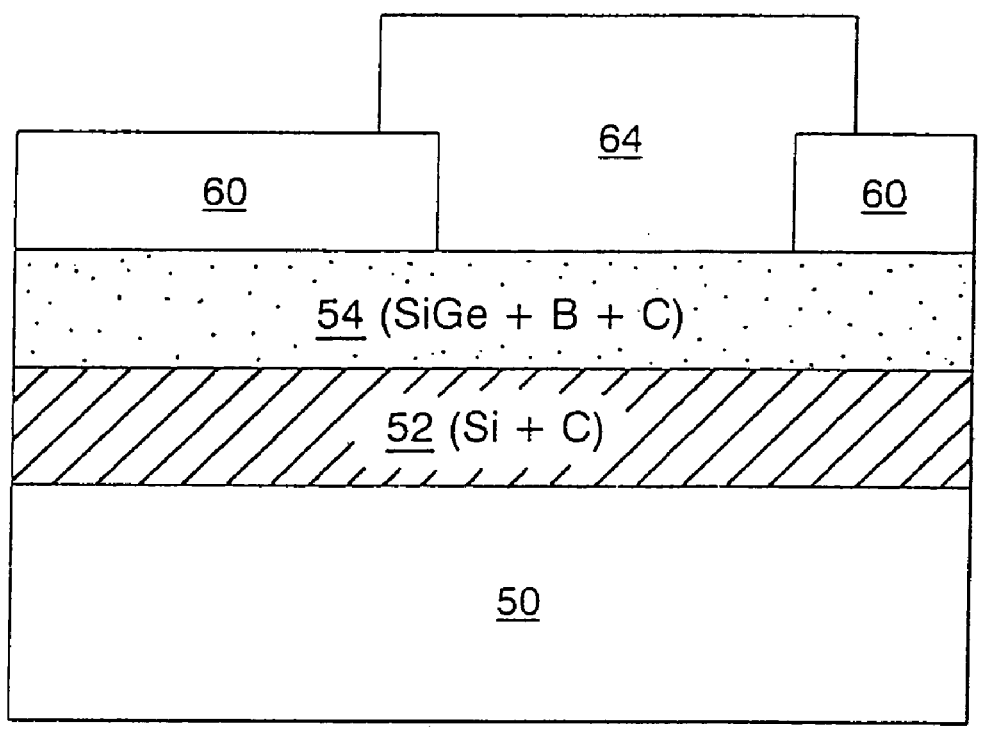

After forming the polysilicon layer in the structure, the polysilicon layer is patterned using conventional lithography and etching forming the structure shown in FIG. 10. Selective etching processes that are capable of removing portions of the insulator and the SiGe layer are then performed so as to provide the structure shown in FIG. 4. The inventive method can also apply to processes commonly known in the art as self-aligned bipolar processes.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claimed is new and desire to secure by the Letters Patent is:

1. A SiGe bipolar transistor comprising:
   a collector region of a first conductivity type;
   a SiGe base region formed on a portion of said collector region; and
   a doped polysilicon emitter region of said first conductivity type formed over a portion of said SiGe base region, wherein said collector region and said SiGe base region include carbon (C), said C is present continuously within said collector region and said SiGe base region or said C is present as discrete intervals separating said SiGe base region from said collector region.

2. The SiGe bipolar transistor of claim 1 wherein C is present in said SiGe base region in a concentration of from about 5E17 to about 1E21 $cm^{-3}$.

3. The SiGe bipolar transistor of claim 1 wherein said C is present in said SiGe base region in a concentration of from about 1E19 to about 1E20 $cm^{-3}$.

4. The SiGe bipolar transistor of claim 1 wherein said C is continuously present in said collector region and said SiGe base region.

5. The SiGe bipolar transistor of claim 1 wherein said C is present as discrete intervals separating the SiGe base region from said collector region.

6. The SiGe bipolar transistor of claim 1 wherein said SiGe base region is an alloyed region comprising SiGe, boron (B) and C.

7. The SiGe bipolar transistor of claim 1 wherein said SiGe base region is doped.

8. The SiGe bipolar transistor of claim 7 wherein said dopant is B.

9. A SiGe bipolar transistor comprising:
   a collector region of a first conductivity type;
   a SiGe base region formed on a portion of said collector region; and
   an emitter region of said first conductivity type formed over a portion of said SiGe base region, wherein said collector region and said SiGe base region include carbon continuously presented therein.

10. A SiGe bipolar transistor comprising:
a collector region of a first conductivity type;
a SiGe base region formed on a portion of said collector region; and
an emitter region of said first conductivity type formed over a portion of said SiGe base region, wherein said collector region and said SiGe base region include carbon, wherein said carbon is present as discrete intervals separating the SiGe base region from said collector region.

* * * * *